United States Patent [19]
Tyson et al.

[11] Patent Number: 5,350,607
[45] Date of Patent: Sep. 27, 1994

[54] IONIZED CLUSTER BEAM DEPOSITION OF SAPPHIRE

[75] Inventors: Scott M. Tyson; Richard Y. Kwor; Leonard L. Levenson, all of Colorado Springs, Colo.

[73] Assignee: United Technologies Corporation, Hartford, Conn.

[21] Appl. No.: 955,607

[22] Filed: Oct. 2, 1992

[51] Int. Cl.$^5$ .................................. C23C 16/48
[52] U.S. Cl. .................... 427/566; 427/529; 427/564; 427/576
[58] Field of Search ............... 427/561, 562, 564, 566, 427/576, 255.3, 248.1, 529

[56] References Cited

U.S. PATENT DOCUMENTS

| | | | |
|---|---|---|---|
| 4,066,527 | 1/1978 | Takagi et al. | 546/70 |
| 4,082,636 | 4/1978 | Takagi | 427/524 |
| 4,139,857 | 2/1979 | Takagi et al. | 342/26 |
| 4,152,478 | 5/1979 | Takagi | 428/221 |
| 4,161,418 | 7/1979 | Morimoto | 437/22 |
| 4,217,855 | 8/1980 | Takagi | 118/719 |
| 4,374,162 | 2/1983 | Takagi | 427/248.1 |
| 4,427,711 | 1/1984 | Martin | 427/248.1 X |
| 4,581,113 | 4/1986 | Morimoto et al. | 204/192.25 |
| 4,799,454 | 1/1989 | Ito | 118/723 |
| 4,805,555 | 2/1989 | Itoh | 118/719 |
| 4,834,809 | 5/1989 | Kakihara | 148/33 |

OTHER PUBLICATIONS

Surface Science 168 (1986); no month, Yamada and Takagi; pp. 365–375; "Film and Interface Properties of Epitaxial Metal/Insulator/Semiconductor Systems Formed by Ionized Cluster Beam Depositon".

Nuclear Instruments and Methods in Physics Research B55 (1991) (no month); Yamada; pp. 544–549; "Recent Progress in Depositing Epitaxial Metal Films by an Ionized Cluster Beam".

J. Appl. Phys. 64(9) (Nov. 1, 1988); Yamada and Torii; pp. 4509–4515; "Thin Heteroepitaxial So–On–Sapphire Films Grown at 600° C. by Reactive Beam Deposition".

Applied Surface Science 33/34 (1988) (no month); Urban et al.; pp. 966–971; "Optical Properties of Reactive ICB Aluminum Oxide Films Deposited on Si(10)".

J. Appl. Phys. 63(1) (Jan. 1, 1988); Hashimoto et al.; "Optical and Structural Characteristics of $AL_2O_3$ Films Deposited by the Reactive Ionized Cluster Beam Method".

IEEE Transactions on Electron Devices 14(5); May 1987; Yamada et al.; "Metallization by Ionized Cluster Beam Deposition".

Nuclear Instruments and Methods in Physics Research B46 (1990) (no month); Soskowski; pp. 397–404; "Ionized Cluster Beam Deposition and Thin Insulating Films".

Japanese Journal of Applied Physics; 30/11B; Ito et al., pp. 3228–3232; "Ionized Cluster Beam Deposition Source for Aluminum and Aluminum Oxide Formation", Nov. 1991.

*Primary Examiner*—Mark L. Bell
*Assistant Examiner*—David Sample
*Attorney, Agent, or Firm*—Richard H. Kosakowski

[57] ABSTRACT

Sapphire, a highly stable oxide of aluminum having the chemical formula of $Al_2O_3$, is placed in a crucible. The crucible is heated to vaporize the sapphire therein. The sapphire vapor is ejected through a nozzle in the crucible and into a region having a vacuum pressure of approximately $10^{-5}$ Torr or less. As the vapor leaves the crucible through the nozzle, atom aggregates or clusters are formed through a supercooled phenomenon due to adiabatic expansion. The vacuum region has disposed therein a substrate comprised of one of various materials, including metals, oxides or silicon. The sapphire vapor is accelerated towards the substrate where it deposits on a surface of the substrate in a uniformly distributed thin layer.

25 Claims, 1 Drawing Sheet

IONIZED CLUSTER BEAM DEPOSITION OF SAPPHIRE

CROSS REFERENCE TO RELATED APPLICATIONS

This application is related to patent application U.S. Ser. No. 07/955,603 titled Ionized Cluster Beam Deposition of Sapphire on Silicon, filed on even date herewith.

TECHNICAL FIELD

The invention relates to ionized cluster beam deposition of films or layers of material on a substrate, and more particularly, to ionized cluster beam deposition of a film of a particular oxide of aluminum—sapphire—on a substrate.

BACKGROUND ART

In the art of deposition of films of material on a substrate, there are many known techniques, including vacuum deposition, ion plating, ion- and plasma-assisted, and the more modern Ionized Cluster Beam ("ICB") technique. ICB is an ion-assisted technique in which the material to be deposited on a substrate is heated in a closed crucible and its vapor ejected through a small nozzle into a vacuum region. The vapor forms loosely held clusters each comprising 100 to 2000 atoms. Some of the ejected vaporized material is ionized by electron bombardment and is accelerated toward the substrate, which is also disposed in the vacuum region. The material arrives at the substrate surface to be deposited thereon together with the neutral (non-ionized) component of the vapor. ICB offers the ability to control the deposited film structure by applying kinetic energy to the cluster vapor beam during film deposition. Kinetic energy control is achieved by varying the acceleration voltage and the electron current for ionization.

In most of the known ion- and plasma-assisted deposition techniques, the individual atoms of the material to be deposited on the substrate impact the substrate with too much kinetic energy, producing a high number of defects. However, with ICB a more useful lateral energy is obtained as the cluster impacts the substrate and the atoms break off. ICB deposition offers the possibility of getting useful energy into the film formation process without damaging the film and substrate surface. Due to the effects of ionized cluster bombardment, ICB produces films with high density, strong adhesion, a low impurity level, and a smooth surface. Further, some of the properties of the films usually associated with high substrate temperature in conventional vacuum depositions can be obtained at low substrate temperature in the ICB technique. This results in a distinct advantage in semiconductor device fabrication. U.S. Pat. Nos. 4,152,478 and 4,217,855 to Takagi describe and claim the ICB method and corresponding apparatus.

In the field of semiconductor processing, the aforementioned deposition techniques have been employed, all with varying disadvantages. Standard bulk silicon-based semiconductor technologies are inherently sensitive to elevated temperature operation as well as to the exposure of ionizing radiation to the large charge collection volumes within the devices. Also, the high parasitic capacitances in these devices tend to decrease operating performance (e.g., speed). These factors have prompted migration to a silicon-on-insulator ("SOI") substrate technology in which collection volumes and parasitic capacitances are dramatically reduced. Several SOI substrate technologies currently exist, e.g., SIMOX, ISE/ZMR, BESOI, FIPOS, etc. However, these technologies possess poor manufacturability or provide poor quality substrates. The result is an expensive substrate which is inadequate for most applications. For example, a five (5) inch SIMOX (i.e., "separation by implantation of oxygen") wafer costs approximately $500–800, compared to $40 for a five (5) inch bulk silicon wafer.

Semiconductor devices have been manufactured on silicon-on-sapphire ("SOS") substrates for several years. However, these SOS wafers are relatively expensive (approximately $500 each) and of very low quality. Additionally, these substrates are incompatible with bulk silicon processing tools due to their thickness, lack of flatness, poor silicon uniformity, and thermal sensitivity. The thickness of the sapphire substrate provides an extremely high hole trapping volume when exposed to total dose ionizing radiation. This complicates the radiation hardened ("rad-hard") aspects of the device design. Also, the sapphire substrates can only be made of a limited size (e.g., five (5) inch wafer diameter or less), making SOS incompatible with trends in VLSI processing.

In order to achieve optimum high temperature performance for semiconductors, a high quality but thin layer of device silicon is required. Up to now, currently available deposition techniques have not adequately provided the quality and thickness control required in these semiconductor applications.

It has been reported that aluminum oxide films of $Al_2O_3$ (i.e., sapphire) have been prepared using ionized Al clusters from an ICB source together with $O_2$ introduced into a vacuum chamber. See Ito et al., "Ionized Cluster Beam Deposition Source for Aluminum and Aluminum Oxide Formation", *Japanese Journal of Applied Physics*, Vol. 30, No. 11B, Nov., 1991, pp. 3228–3232. The ICB apparatus described therein has no electron extractor. Such use of $O_2$ is referred to as a reactive ionized cluster beam process, or R-ICB. A further example of the deposition of $Al_2O_3$ using the R-ICB method is found in Sosnowski et al., "Ionized Cluster Beam Deposition and Thin Insulating Films", *Nuclear Instruments and Methods in Physics Research*, B46, (1990), pp. 397–404.

Sapphire, the highly stable oxide of aluminum, used in many applications due to its many advantageous features. Such features include high melting temperature, chemical stability and resistance to many commercial etchants, ease of maintaining proper stoichiometry, optical transparency, excellent dielectric properties, high thermal conductivity, ease of handling, relatively low cost, and relatively low deposition temperature. In the semiconductor industry, deposited films such as sapphire, crystalline polysilicon ("poly"), or aluminum alloys are used to create many of the wiring and insulating layers. After the metal layers are patterned, dielectric films are used to electrically isolate one metal layer of wiring from another. In this context, the dielectric properties of the film are highly important. Also, the ability to conduct heat away from the active devices or from the metal wiring is significant from a reliability standpoint.

However, in both of the above reported $Al_2O_3$ ICB deposition techniques, the starting material was aluminum and not sapphire. The aluminum was vaporized and accelerated through the oxygen environment. It is well known that aluminum in an oxygen ambient is highly reactive. Thus, the crucible containing the aluminum starting material typically comprises a more costly tungsten material instead of a lesser expensive graphite. Also, the oxygen introduces yet another complexity, i.e., that of uniformly controlling the flow rate of oxygen across the diameter of the wafer. Any resulting perturbations in the flow rate can cause a lack of uniformity in the deposition of the resulting $Al_2O_3$ on the substrate. Therefore, up until now, there has not been reported any deposition of $Al_2O_3$ directly onto a silicon substrate using the ICB methodology.

DISCLOSURE OF THE INVENTION

One aspect of the present invention is to provide for an easily manufacturable method of depositing a high quality yet thin layer of $Al_2O_3$ on various types of substrates—including metals, oxides or silicon-using the ionized cluster beam methodology and apparatus.

According to the present invention, sapphire, an oxide of aluminum having the chemical formula of $Al_2O_3$, is placed in a crucible, the crucible is heated to vaporize the sapphire therein, the sapphire vapor is ejected through a nozzle in the crucible and into a region having a vacuum pressure of approximately $10^{-5}$ Torr or less such that atom aggregates or clusters are formed through a supercooled phenomenon due to adiabatic expansion, the vacuum region has disposed therein a substrate, the substrate may comprise various materials, including metals, oxides and silicon, the sapphire vapor being accelerated towards the substrate where it deposits on a surface of the substrate in a uniformly distributed thin layer.

The present invention has utility in providing an inexpensive, yet highly manufacturable, ICB substrate material technology having, relative to the aforementioned prior art deposition techniques, improved interface properties, excellent film thickness control and uniformity, high batch to batch uniformity due to single wafer processing, improved silicon quality, and freedom from conductive buried pipes. These attributes translate into improved parametric performance of a resulting semiconductor device over varying temperature due to fewer recombination and generation sites. The thin buried dielectric film also provides for enhanced radiation hardening.

The present invention represents an alternative to currently available SOI substrate technologies. It is highly manufacturable and provides low cost SOI substrates. It also provides reduced substrate damage and high deposition rates at low temperatures. Applications for such substrates include high temperature and radiation environments, along with integrated sensors. Further, for application of sapphire on a bulk silicon substrate, the selection of crystalline $Al_2O_3$ as the dielectric material in the SOI application is based upon its close lattice constant match to the silicon crystal structure as well as to sapphire's ability to withstand standard silicon semiconductor fabrication techniques and environments. In addition, the crystalline $Al_2O_3$ insures the proper stoichiometry of the aluminum and oxygen components.

These and other objects, features and advantages of the present invention will become more apparent in light of the detailed description of a best mode embodiment thereof, as illustrated in the accompanying drawings.

BEST MODE FOR CARRYING OUT THE INVENTION

Figure 1:
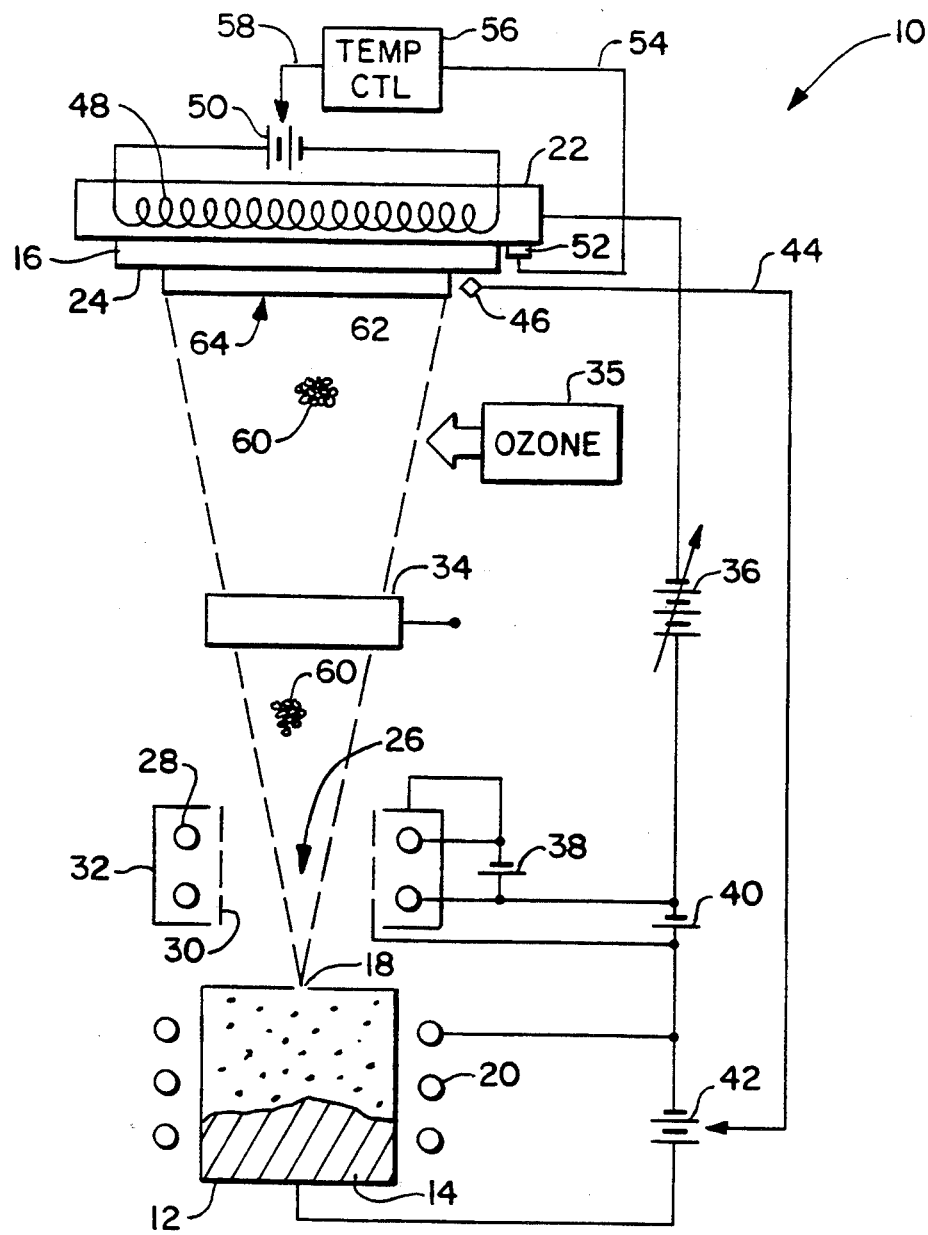
FIG. 1 is a schematic illustration of ICB apparatus for depositing a layer of $Al_2O_3$ on a substrate in accordance with the present invention.

Referring to FIG. 1, the known ICB material deposition apparatus 10 illustrated therein is available from, e.g., Mitsubishi Corporation, Itami Works, Hyogo, Japan. The general operating principle of the ICB apparatus 10 is as follows: clusters of atomic material to be deposited on a substrate are formed by adiabatic expansion of material vapor passing through a nozzle. The clusters are then ionized by impact ionization using electrons of an appropriate energy. Cluster sizes distribute in a range of, e.g., 100 to 2000 atoms per cluster. The clusters bombard the substrate surface, and both ionized and neutral clusters are broken up and redistributed due to the high surface mobility of the loosely-held clusters. The scattered atoms may move over the surface with such surface diffusion energy before they are physically attracted to the substrate surface. Such attraction is due to high kinetic energy parallel to the surface caused by conversion from the incident kinetic energy. Thus, the crystallographic structure and physical properties of thin films are found to be strongly dependent upon the energy of the ionized material, such energy being controlled by the acceleration voltage during film deposition and, to a lesser extent, by the temperature of the substrate.

The aforementioned U.S. Pat. Nos. 4,152,478 and 4,217,855 to Takagi describe the Ionized Cluster Beam ("ICB") method and corresponding device, these patents being hereby incorporated by reference. Further, these patents describe in detail the mechanism of cluster formation by referring to microscopic analysis based upon statistical mechanics.

The method of depositing a thin, high quality film of sapphire on a substrate in accordance with the present invention is described hereinafter with reference to FIG. 1. The ICB apparatus 10 includes a crucible 12 containing a desired type of source material 14 to be deposited on a substrate 16 of desired material. The crucible 12 may be comprised of, e.g., relatively inexpensive but purified graphite. The crucible contains $Al_2O_3$ (sapphire) 14 in one of many physical forms: either pellets, powder, granules, sphereodized, etc. The sapphire is commercially available from Crystar, Victoria, British Columbia, Canada. The physical form of the sapphire in the crucible is irrelevant to the invention since, as will be described hereinafter, the sapphire is heated and melted until its vapor state is realized.

The crucible has at least one small diameter ejection nozzle 18 and also has heating elements 20, e.g., filaments, disposed adjacent to the walls thereof. The filaments 20 heat the crucible by emitting electrons which impact the crucible. It is to be understood, however, that crucible heating may occur through other methods. One is radiation heating where heat is generated by a crucible heating filament. Another is resistance heating using electrons emitted from filaments located within the crucible walls. In this method electrical current is flowed directly through the outer surface of the crucible. The method chosen for heating the crucible is irrelevant to the present invention; any method or combination thereof may be used without departing from the broadest scope thereof.

A substrate holder 22, which holds the substrate 16, comprises an electrically conducting material. As described in more detail hereinafter, a surface 24 of the substrate has the sapphire deposited thereon by the ICB apparatus 10 in accordance with the present invention.

Disposed above, and in proximity to, the ejection nozzle 18 of the crucible is an ionization chamber 26. The chamber 26 has one or more filaments 28 for emitting electrons. The chamber also has acceleration electrodes 30 for accelerating the electrons emitted from the filaments, and a shield 32 for preventing undesirable scattering of the electrons. Disposed above the chamber is a shutter 34, which selectively prevents vapor of the sapphire ejected from the crucible 12 through the nozzle 18 from impinging on the substrate surface 24.

All of the aforementioned components of the ICB machine are disposed within a high vacuum chamber (not shown) having a pressure of preferably $10^{-5}$ Torr of less. An ozone source 35 may be provided for injecting a flow rate of ozone into the high vacuum chamber.

A variable power supply 36 is connected between the substrate holder 22 and the ionization chamber 26. The supply 36 maintains the substrate holder at a relatively high negative potential with respect to the chamber. The resulting electric field imparts kinetic energy to the positively ionized sapphire clusters for their accelerated movement toward the substrate surface. A second power supply 38 is connected across the filaments 28 within the chamber. The supply 38 energizes the filament, causing it to emit electrons.

A third power supply 40 is connected between the filaments 28 and acceleration electrode 30. The supply 40 keeps the acceleration electrode at a highly positive potential with respect to the filament. This accelerates the electrons emitted from the filaments and ionizes some portion of the sapphire clusters in the ionization chamber. Thus, this supply 40 provides the ionization current parameter discussed hereinafter.

A fourth power supply 42 energizes the filaments 20 of the crucible 12. The filaments emit electrons which heat the crucible in accordance with the aforedescribed electron impact method. The supply 42 may be controlled by a signal on a line 44 provided by a quartz crystal 46. The crystal 46 is disposed in close proximity to the substrate 16. The crystal vibrates at a measurable frequency. As more of the sapphire is deposited on the substrate, the vibration frequency of the crystal decreases. Since the change in the vibration frequency is related to the deposition rate, it follows from the foregoing that the crystal provides a simple method of monitoring the deposition rate of the sapphire on the substrate. The supply 42 is responsive to the signal on the line 44 to vary the heating of the crucible 12. As the deposition rate decreases, the crucible may be heated to effectively increase the deposition rate.

The substrate holder 22 has a heater 48 therein, e.g., a coil, for heating the substrate 16 to the desired temperature. That is, if the substrate is monocrystalline, and the material is epitaxially grown on the substrate, then the coil 48 heats the substrate to a temperature which facilitates epitaxial growth. A power supply 50 powers the coil in the substrate holder. A thermocouple 52 attached to the substrate provides a signal on a line 54 indicative of the temperature of the substrate. The signal is fed to a circuit 56 which compares the actual substrate temperature on the line 54 with a desired substrate temperature provided by an operator of the ICB apparatus. Any difference therebetween is provided on a signal line 58 to control the power supply 50.

However, it is to be understood that the substrate 16 may comprise various types of materials, having either monocrystalline or polycrystalline structure. For a substrate having a polycrystalline structure, then epitaxial growth of sapphire thereon is not a concern. Instead, the sapphire is deposited amorphously. Examples of materials comprising the substrate 16 include: metals, such as aluminum or aluminum alloys; oxides, such as silicon dioxide, silicon nitride, or doped or undoped glasses; and bulk silicon.

In light of the foregoing description of the ICB machine 10, the method of depositing sapphire 14 on a substrate 16 according to the present invention follows. The sapphire starting material 14 is loaded into the crucible 12. The substrate 16 is loaded into the substrate holder 22. The sapphire crucible heating filaments 20 and the substrate holder heater 48 are energized by the corresponding power supplies 42,50. As the sapphire crucible 12 heats up, the sapphire therewithin becomes a vapor.

The filaments 20 heat the sapphire crucible 12 to a desired temperature. The crucible temperature is regulated so that the pressures of the vapor in the crucible may exceed at least 100 times the pressure outside the crucible in the vacuum region. The greater the difference between the internal and external pressures of the crucible, the greater the ejection velocity of the vaporized material exiting the crucible.

The shutter 35 is opened to allow the sapphire material ejected from the nozzle 18 of the sapphire crucible 12 to travel toward the substrate 16. The substrate heater 48 heats the substrate to a temperature of 400 to 600 degrees C., with a preferred value of approximately 600 degrees C. The acceleration power supply 36 is initially set to 500V. The ionization current power supply 40 is adjusted to provide an ionization current in the range of 200 to 300 milliamps ("mA"), with a preferred value of 250 mA. The ozone source 35 is adjusted to provide an oxygen partial pressure within the high vacuum region in the range of $5 \times 10^{-5}$ to $1 \times 10^{-4}$ Torr.

The sapphire vapor in the crucible is ejected into the vacuum region where it is supercooled due to the adiabatic expansion thereof. As a result, the sapphire vapor forms atomic groups or clusters 60, each cluster 60 typically comprising approximately 100 to 2000 atoms loosely bonded together by van der Waals attractive forces.

Through kinetic energy imparted to the sapphire when ejected through the nozzle, the sapphire clusters enter the ionization chamber 26. There, the sapphire clusters are bombarded by electrons emitted from the filaments 28. Such electron bombardment ionizes at least one of the atoms within several of the clusters, thus forming partially ionized clusters. The ionization current is controlled by the ionization power supply 40. Other clusters are not ionized and, thus, remain neutral.

The acceleration power supply 36 imparts kinetic energy to the ionized sapphire clusters to move and accelerate them toward the substrate. The energies imparted to the ionized clusters are controlled through variation of the acceleration power supply. The neutral clusters not ionized in the ionization chamber also move toward the substrate by the action of the kinetic energy received by the clusters when ejected out the crucible nozzle. When the clusters reach the substrate surface 24, both types of clusters impinge on the surface, forming thereon a high quality film of sapphire.

When the ionized clusters collide with the substrate, most of the kinetic energy of the clusters is converted into thermal energy. This energy is imparted to the substrate to the surface layer of sapphire being deposited thereon. At the same time, each ionized cluster itself is disintegrated into individual atomic particles which move on the deposited surface layer to facilitate the growth of a crystal due to the migration effects. Such effects can also be expected in the case of the neutral or non-ionized clusters. The migration effects are created at an elevated temperature caused by the thermal energy converted from the kinetic energy of the clusters and imparted to the deposited substrate surface layer. These effects cause the growth of a crystal film oriented by the crystal axis of the substrate.

The initial acceleration voltage of 500V causes the initial clusters that strike the substrate surface to sputter and clean such surface. The acceleration voltage is then reduced to approximately 200 to 300V. Deposition of sapphire on the substrate surface proceeds at a rate of approximately 40 Angstroms per minute. A layer 62 of sapphire is deposited on the substrate to a thickness of between 200 and 4000; Angstroms.

Figure 2:
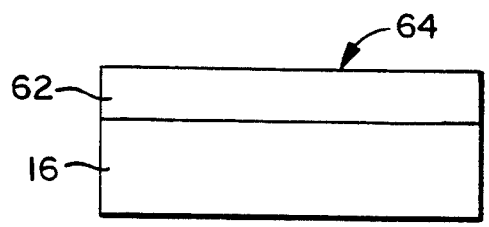
FIG. 2 is a plan view of the resulting layer of $Al_2O_3$ deposited on the substrate using the ICB apparatus of FIG. 1.

Once the sapphire layer 62 has been formed, the shutter 34 is closed, all power supplies are turned off, and the resulting sapphire-substrate wafer 64 is allowed to cool before being removed from the ICB apparatus. Alternatively, a protective film of an oxide may be deposited on the surface of the deposited sapphire before removing the wafer 64 from the ICB apparatus. Such deposition of oxide is well known to one of ordinary skill in the art. Although not required, the wafer may, if desired, be annealed at high temperature after removal from the ICB apparatus. FIG. 2 illustrates the resulting wafer 64.

With the method of the present invention, the total substrate fabrication time per wafer is approximately fifteen (15) minutes (not including heating and cooling times), and requires no additional. thermal processing (i.e., annealing). By comparison, SIMOX substrates require greater processing time than that for oxygen implantation, but then additionally require a lengthy eight (8) hour high temperature thermal anneal plus silicon epitaxy processing or oxidation thinning to achieve the desired film thickness.

Although the invention has been illustrated and described with respect to a best mode embodiment thereof, it should be understood by those skilled in the art that the foregoing and various other changes, omissions, and additions in the form and detail thereof may be made without departing from the invention.

We claim:

1. A method of depositing a layer of sapphire on a surface of a substrate, comprising the steps of:
    depositing sapphire in a crucible having a nozzle;
    positioning said crucible in a vacuum chamber having a first pressure level;
    positioning said substrate in said vacuum chamber;
    heating said crucible to a first temperature to cause said sapphire to be vaporized at a second pressure level within said crucible, said second pressure level being greater in magnitude than said first pressure level, such that said vapor is ejected through said nozzle, thereby forming clusters of sapphire by adiabatic expansion, said sapphire clusters being formed in said vacuum chamber outside of said crucible in the vicinity of said nozzle;
    bombarding said sapphire clusters with electrons, thereby resulting in some number of said sapphire clusters being partially ionized along with some number of sapphire clusters remaining non-ionized; and
    accelerating both said ionized and non-ionized sapphire clusters toward a surface of said substrate to form a deposited sapphire film thereon of a thickness.

2. The method of claim 1, wherein said first pressure level of said vacuum chamber is no greater than $1 \times 10^{-5}$ Torr.

3. The method of claim 1, wherein said crucible is comprised of graphite.

4. The method of claim 1, wherein said step of heating said crucible comprises the step of emitting electrons towards said crucible so as to heat said crucible by electron impact.

5. The method of claim 1, wherein said step of heating said crucible comprises the step of resistive heating.

6. The method of claim 1, wherein said step of accelerating said sapphire clusters towards said substrate comprises the step of applying an acceleration voltage between said crucible and said substrate.

7. The method of claim 6, wherein said acceleration voltage is substantially in the range of 200 to 500 volts.

8. The method of claim 1, further comprising the step of heating said substrate to a second temperature.

9. The method of claim 8, wherein said second temperature is substantially in the range of 400 to 600 degrees centigrade.

10. The method of claim 1, further comprising the step of providing an oxygen partial pressure within said vacuum chamber in the range of $5 \times 10^{-5}$ to $1 \times 10^{-4}$ Torr.

11. The method of claim 1, wherein said step of bombarding said sapphire clusters with electrons comprises the step of applying an electron ionization current to an electron emitting filament.

12. The method of claim 11, wherein said electron ionization current is in the range of 200 to 300 milliamps.

13. The method of claim 1, wherein said substrate comprises aluminum.

14. The method of claim 1, wherein said substrate comprises an aluminum alloy.

15. The method of claim 1, wherein said substrate comprises an oxide.

16. The method of claim 1, wherein said substrate comprises silicon dioxide.

17. The method of claim 1, wherein said substrate comprises silicon nitride.

18. The method of claim 1, wherein said substrate comprises doped glass.

19. The method of claim 1, wherein said substrate comprises undoped glass.

20. The method of claim 1, wherein said substrate comprises silicon.

21. The method of claim 1, wherein said first temperature of said crucible is controlled by a vibration frequency of a crystal coupled to said substrate, said vibration frequency corresponding to a deposition rate of said deposited sapphire film on said substrate.

22. A method for forming a sapphire layer superjacent a substrate, said method comprising the steps of:

providing sapphire in a crucible having a nozzle;

positioning said crucible and a substrate within a vacuum chamber, said vacuum chamber having a first pressure level, said substrate comprising at least one of single crystal silicon, polycrystalline silicon, amorphous silicon, aluminum, silicon dioxide, silicon nitride, doped glass, undoped glass, and an oxide;

heating said crucible to a first temperature to vaporize said sapphire at a second pressure level within said crucible;

regulating said heating of said crucible at said first temperature by a vibration frequency of a crystal coupled to said substrate, said vibration frequency corresponding to a deposition rate of said deposited sapphire film on said substrate, such that said second pressure level substantially exceeds said first pressure level, thereby forming clusters of sapphire and ejecting said sapphire clusters from said crucible in the direction of said substrate;

ionizing a portion of said sapphire clusters by electron bombardment, thereby providing a remaining portion of non-ionized sapphire clusters; and accelerating both said ionized and said non-ionized clusters toward said substrate, thereby forming a sapphire film superjacent said substrate.

23. The method of claim 22, wherein said regulating comprises the step of:

supercooling said ejected sapphire clusters by means of adiabatic expansion.

24. The method of claim 22, wherein said regulating comprises the step of:

heating said substrate to a temperature substantially in the range of 400 to 600 centigrade after said sapphire clusters are ejected.

25. The method of claim 22, further comprising the step of:

introducing an oxygen partial pressure within said vacuum chamber in the range of $5 \times 10^{-5}$ and $10^{-4}$ Torr.

* * * * *

UNITED STATES PATENT AND TRADEMARK OFFICE
CERTIFICATE OF CORRECTION

PATENT NO. : 5,350,607

DATED : September 27, 1994

INVENTOR(S) : Scott M. Tyson et al

It is certified that error appears in the above-identified patent and that said Letters Patent is hereby corrected as shown below:

Column 2, line 51, after "aluminum," insert --is--

Column 3, lines 25-26, "$Al-_2O_3$" should read --$Al_2O_3$--

Column 4, line 42, "Further." should read --Further,--

Column 6, line 41, "C.," should read --C,--

Column 7, line 30, "4000; Angstroms." should read --4000 Angstroms.--

Signed and Sealed this

Twenty-fifth Day of June, 1996

BRUCE LEHMAN

*Attest:*

*Attesting Officer*     *Commissioner of Patents and Trademarks*